Jan. 14, 1969 CARL-ERIK GRANQVIST 3,422,379

HIGH-FREQUENCY TUNING DEVICE

Filed Oct. 25, 1965 Sheet 1 of 2

INVENTOR
CARL E. GRANQVIST

BY Larson and Taylor

ATTORNEYS

INVENTOR
CARL E. GRANQVIST

BY Larson and Taylor
ATTORNEYS

United States Patent Office 3,422,379

Patented Jan. 14, 1969

3,422,379

HIGH-FREQUENCY TUNING DEVICE

Carl-Erik Granqvist, Lidingo, Sweden, assignor to AGA Aktiebolag, Lidingo, Sweden, a corporation of Sweden Filed Oct. 25, 1965, Ser. No. 505,153
Claims priority, application Sweden, Nov. 23, 1964, 14,139/64
U.S. Cl. 333—82 5 Claims
Int. Cl. H01p *7/00;* H01h *3/00*

The present invention relates to a tuning device for high frequencies covering a relatively wide range of wavelengths and having a high degree of efficiency.

For high frequencies, such as from 200 to 400 mHz., it is difficult to build circuits with a high *L/C* ratio, which is required in order to obtain a circuit of broad band width and havng a large tunng range. Conventional arrangements make use of a rod-shaped conductor having sliding contact, whereby a wide tuning range is achieved in combination with a high ratio of *L/C* for the circuit. However, experience has proved sliding contacts to be unsatisfactory in operation owing to bad electrical contact. Also, this type of arrangement is very bulky.

In order to avoid these difficulties, it has been proposed to utilize a conductor whose characteristic impedance was changed by variation of the distance of the conductor to a conductive plane or ground plane. If a wide tuning range is to be obtained in such an arrangement, it is however necessary to vary the characteristic impedance within a very wide range, which means that the conductor must be brought extremely close to the ground plane in one of its terminal positions. This implies a great risk of break-down at the same time as a high degree of mechanical tolerance and stability it required.

These draw-backs are obviated in the tuning device according to the invention by the provision, in addition to a capacitor, of a plurality of parallel-connected conductors, the characteristic impedance of which is varied during tuning by changing the distance of each conductor from a ground plane, the conductors being adapted to be brought together when at the maximum distance from the ground plane, whereby in said position their combined characteristic impedance is substantially the same as that of a single conductor.

Figure 1:
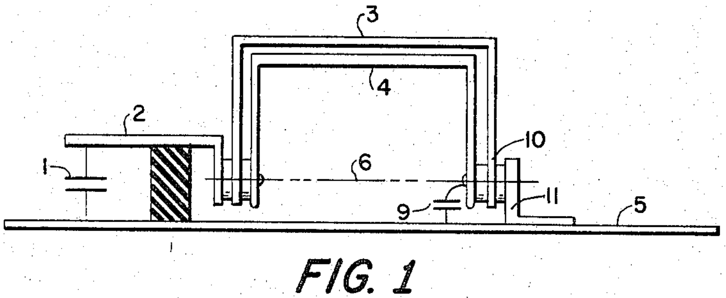
Figure 2:
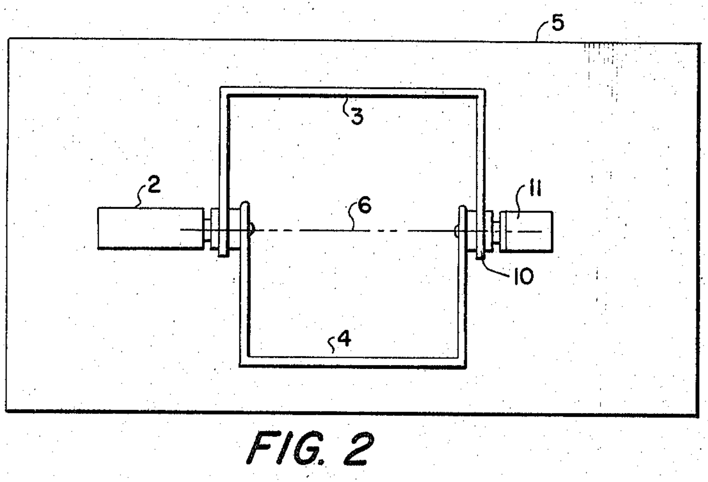

The invention is described below with reference to the attached drawings, in which FIGS. 1 and 2 are a lateral view and a plan view, respectively, of an embodiment, and FIGS. 3 to 7 are further embodiments thereof.

The tuning device shown in FIGS. 1 and 2 in lateral and plan view, respectively, comprises a capacitor 1 connected via a connection 2 with a pair of conductors 3 and 4 which are bent to U-shape and are supported at their ends so as to be turnable about an axis 6 which is parallel to a conductive ground plane 5. The supports are assumed to be constructed so as to provide good electrical contact between the elements 2, 3 and 4.

FIG. 1 shows the two conductors 3 and 4 in the upper position, in which the characteristic impedance is high, which means that the inductance has a high value. The fact that the two conductors 3 and 4 are in parallel is of little importance in this position, since the two conductors cover each other, whereby the capacitance to the ground plane 5 is practically the same as for a single conductor.

In the lower position shown in FIG. 2, the two conductors are at a small distance from the ground plane 5, whereby the characteristic impedance is low. Assuming a value of 50 ohms as the impedance of each conductor, the characteristic impedance of the two conductors 3 and 4 in parallel in the position shown in FIG. 2 will be 25 ohms. Assuming furthermore the characteristic impedance for the conductors in the other position shown in FIG. 1 to be 100 ohms, this means that a tuning range of about 1:2 will be obtained.

In order to provide the lowest possible value for the characteristic impedance in the lower position, it is suitable to provide a recess in the ground plane for accommodating the conductors 3 and 4 when in the lower position. Such an embodiment is illustrated in FIG. 3, in which a recess 7 of a shape corresponding to the conductors 3 and 4 is provided in the ground plane 5.

Figure 3:
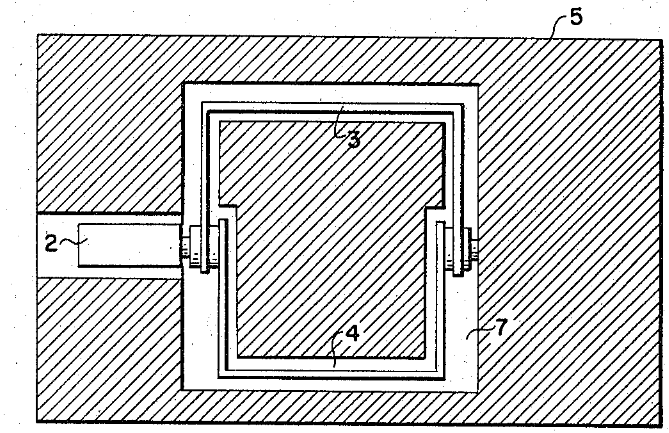
Figure 4:
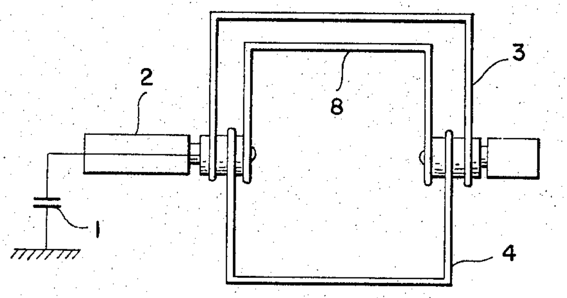

The embodiments of FIGS. 1 to 3 make use of two conductors. In principle, however, it is possible to provide a larger number of conductors in parallel, such as three, as illustrated in FIG. 4, which shows three conductors 3, 4 and 8 in parallel. In this embodiment it is also possible to select the size of the individual conductors so as to provide a stepwise change in frequency when one or more conductors are folded down towards the ground plane.

The highest frequency $\omega_{max}$ obtainable with the device of the invention is determined by the electrical length $\alpha$ of the conductor and by the magnitude of the capacity C to which the conductor is connected. In accordance with $$\omega_{max} = \frac{1}{C \cdot Z_{min} \cdot tg\alpha} \quad (1)$$

where $Z_{min}$ designates the minimum characteristic impedance for the conductors. It is apparent from this equation that the length of the conductor cannot surpass 90°, independently of the minimum value obtainable for C and for $Z_{min}$. This sets a limit also to the lowest obtainable frequency. It is true that the electrical length of the conductor can be increased as indicated in FIG. 1 by means of a series capacitor 9 connected between the end 10 of the conductors 3 and 4 that would otherwise be directly grounded through the support 11 on the one hand and the ground plane 5 on the other. However, such a series capacitor cannot increase the tuning range. Such an increase can be achieved by providing a small variable capacitor in parallel or in series with the system, but this in turn lowers the efficiency.

Figures 5, 6, 7:
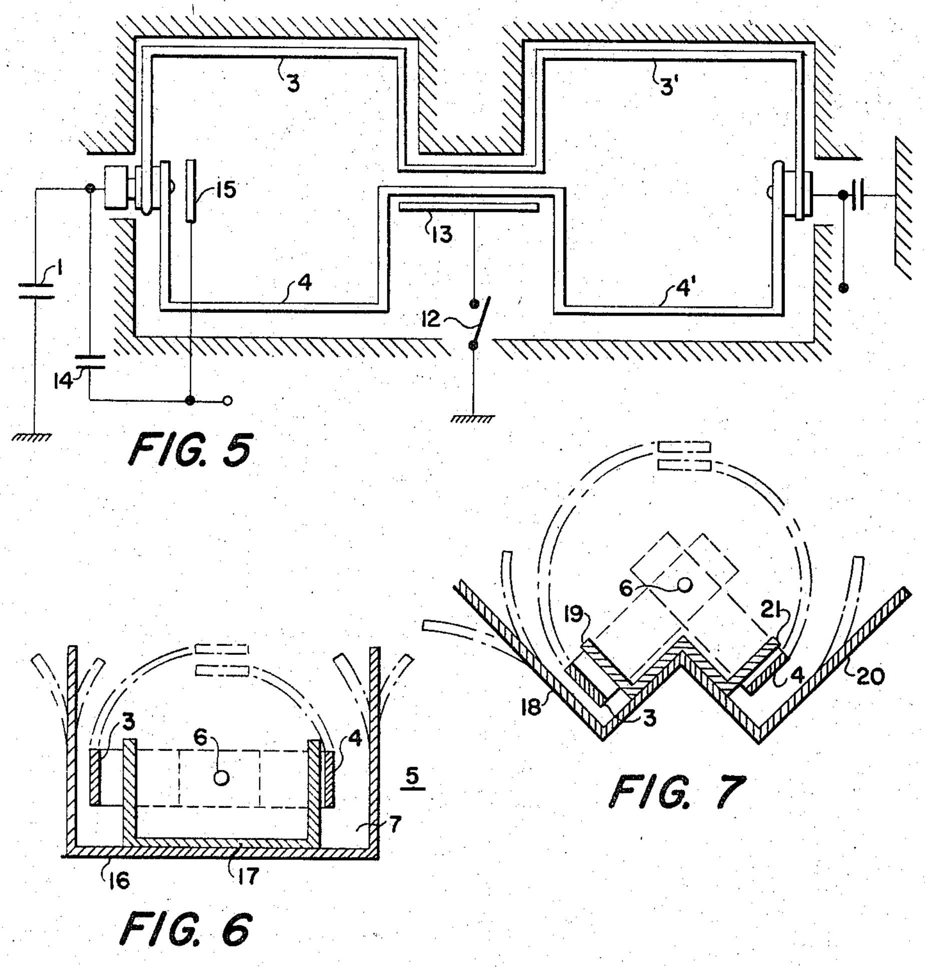

To obtain a wide tuning range, such as from 100 to 400 mHz., it is more practical to provide in the manner shown in FIG. 5 two systems in tandem, the total tuning range being then subdivided into two partial ranges and the one system being short-circuited when the transition to the other partial range is made. Such short-circuiting may be provided with the aid of a switch 12, which in its closed position grounds a short-circuiting plate 13 provided between the two systems. The systems are designated in FIG. 5 by 3 and 4 for the one and 3' and 4' for the other system.

For the higher frequency range, when only the systems 3, 4 shown to the left is operative, it is suitable to feed energy into the system and derive the output therefrom by means of a series capacitor 14 connected to the point of highest voltage on the conductors 3, 4. Preferably, there is also provided a small coupling capacitance in the form of a small metal plate 15 to provide direct coupling to the circuit when the conductors are in the upper position. For the lower frequency range, when both the conductors 3 and 4 and the conductors 3' and 4' are operative, there are no difficulties in providing a series capacitance for higher output energy.

As shown in FIG. 6, the ground plane 5 with the recess 7 can be manufactured in a simple way by joining an outer box 16 with an inner box 17. The conductors 3 and 4 are turnable about the axis 6 from the position shown in full lines to the upper position shown in dotted lines. As indicated in FIG. 6, the walls of the outer box 16 may extend higher than those of the inner box and be flexible outwardly or inwardly to provide trimming of the frequency adjustment.

If the ground plane is composed in the manner shown in FIG. 7 of two portions 18 and 19 on the one hand and 20 and 21 on the other hand standing at an obtuse angle relative to each other, a wider tuning range is obtained with better tolerance with respect to the angular position. In this case also, the walls of the outer box may be flexible inwardly or outwardly to provide the required trimming in the FIG. 7 embodiment, the axis of rotation 6 for the conductors 3 and 4 is in the plane of symmetry between the elements 18, 19 and 20, 21 outside the corner formed by the obtuse angle.

What I claim is:

1. Tuning device for high frequencies, characterized in that it comprises in addition to a capacitor (1) a plurality of conductors (3, 4, 8) in parallel, the characteristic impedance of which is changed during tuning through a variation of the distance of each conductor to a ground plane (5), the conductors being adapted to be brought together when at the largest distance from the ground plane, whereby in said position their combined characteristic impedance is substantially the same as that of a single conductor.

2. Tuning device according to claim 1, characterized in that the conductors comprise mutually concentrical U-shaped bands supported at the ends to be turnable about an axis (6) parallel to the middle portion thereof.

3. Tuning device according to claim 1, characterized in that the ground plane (5) is provided with a recess (7) adapted to accommodate the conductors when they are folded downwardly towards the ground plane and to provide a low minimum characteristic impedance.

4. Turning device according to claim 3, characterized in that the ground plane (5) is provided with walls which are flexible towards and away from the conductors to provide trimming of the characteristic impedance.

5. Tuning device according to claim 2, characterized in that the ground plane is composed of two portions standing at an obtuse angle relative to each other, the axis of rotation (6) for the conductors being in the plane of symmetry between said portions (18, 19 and 20, 21) outside of the corner formed by the obtuse angle.

References Cited

UNITED STATES PATENTS

| | | | |
|---|---|---|---|
| 1,083,085 | 12/1913 | Gowing et al. | 334—71 X |
| 2,511,586 | 6/1950 | Hubbard | 334—45 X |
| 2,554,295 | 5/1951 | Cooper | 333—82 |
| 2,560,685 | 7/1951 | Cooper | 333—35 X |
| 2,631,241 | 3/1953 | Schmidt | 334—42 |
| 2,719,273 | 9/1955 | Rambo et al. | 334—44 X |

FOREIGN PATENTS

| | | |
|---|---|---|
| 649,749 | 1/1951 | Great Britain. |

HERMAN KARL SAALBACH, *Primary Examiner.*

W. H. PUNTER, *Assistant Examiner.*

U.S. Cl. X.R.

333—33; 334—45, 47, 61, 71, 44